(12) United States Patent
Goto et al.

(10) Patent No.: US 7,989,856 B2
(45) Date of Patent: Aug. 2, 2011

(54) FIN TRANSISTOR

(75) Inventors: Masakazu Goto, Yokohama (JP);
Nobutoshi Aoki, Yokohama (JP);
Takashi Izumida, Yokohama (JP);
Kimitoshi Okano, Yokohama (JP);
Satoshi Inaba, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 243 days.

(21) Appl. No.: 12/335,701

(22) Filed: Dec. 16, 2008

(65) Prior Publication Data
US 2009/0152623 A1    Jun. 18, 2009

(30) Foreign Application Priority Data
Dec. 17, 2007   (JP) ................................. 2007-324408

(51) Int. Cl.
*H01L 21/336* (2006.01)

(52) U.S. Cl. .............................. 257/288; 257/E29.051

(58) Field of Classification Search .................. 257/288, 257/E29.051, E29.052
See application file for complete search history.

(56) References Cited

U.S. PATENT DOCUMENTS

| | | | |
|---|---|---|---|
| 2006/0180866 A1* | 8/2006 | Zhu et al. | 257/368 |
| 2007/0096206 A1 | 5/2007 | Chidambarrao | |
| 2007/0134884 A1 | 6/2007 | Kim et al. | |
| 2007/0221956 A1 | 9/2007 | Inaba | |
| 2007/0252211 A1* | 11/2007 | Yagishita | 257/351 |

OTHER PUBLICATIONS

U.S. Appl. No. 12/421,143, filed Apr. 9, 2009, Okano.

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

A fin transistor includes: a substrate; a plurality of semiconductor fins formed on the substrate; a gate electrode covering a channel region of the semiconductor fins; and a member as a stress source for the semiconductor fins included in a region of the gate electrode and the region provided between the semiconductor fins, and the member being made of a different material from the gate electrode.

18 Claims, 8 Drawing Sheets

B-B section

C-C section

US 7,989,856 B2

FIN TRANSISTOR

CROSS-REFERENCE TO RELATED APPLICATION

This application is based on and claims the benefit of priority from prior Japanese Patent Application No. 2007-324408, filed on Dec. 17, 2007, the entire contents of which are incorporated herein by reference.

BACKGROUND OF THE INVENTION

An attempt to improve carrier mobility in an inversion layer by applying a stress to a channel region in a planar FET has been made. For example, a method of applying a stress to a channel region by etching a part of a drain region and/or source region and filling therein a semiconductor having different lattice constant is used (for example, JP. 2007-129235).

However, in a fin-type MOS transistor (hereinbelow, Fin FET), a material having different lattice constant can be buried in a part of a fin, but it is difficult to effectively apply a stress to the channel region.

SUMMARY OF THE INVENTION

A fin transistor according to one aspect of the invention includes: a substrate; a plurality of semiconductor fins formed on the substrate; a gate electrode covering a channel region of the semiconductor fins; and a member as a stress source for the semiconductor fins included in a region of the gate electrode and the region provided between the semiconductor fins, and the member being made of a different material from the gate electrode.

A fin transistor according to another aspect of the invention includes: a semiconductor substrate; a plurality of semiconductor fins formed over the substrate so as to be isolated from the semiconductor substrate by an insulating layer; a gate electrode covering a channel region of the semiconductor fins; and a member as a stress source for the semiconductor fins included in a region of the gate electrode and the region provided between the semiconductor fins, and the member being made of a different material from the gate electrode.

DETAILED DESCRIPTION OF THE EMBODIMENTS

First Embodiment

Figure 1A:
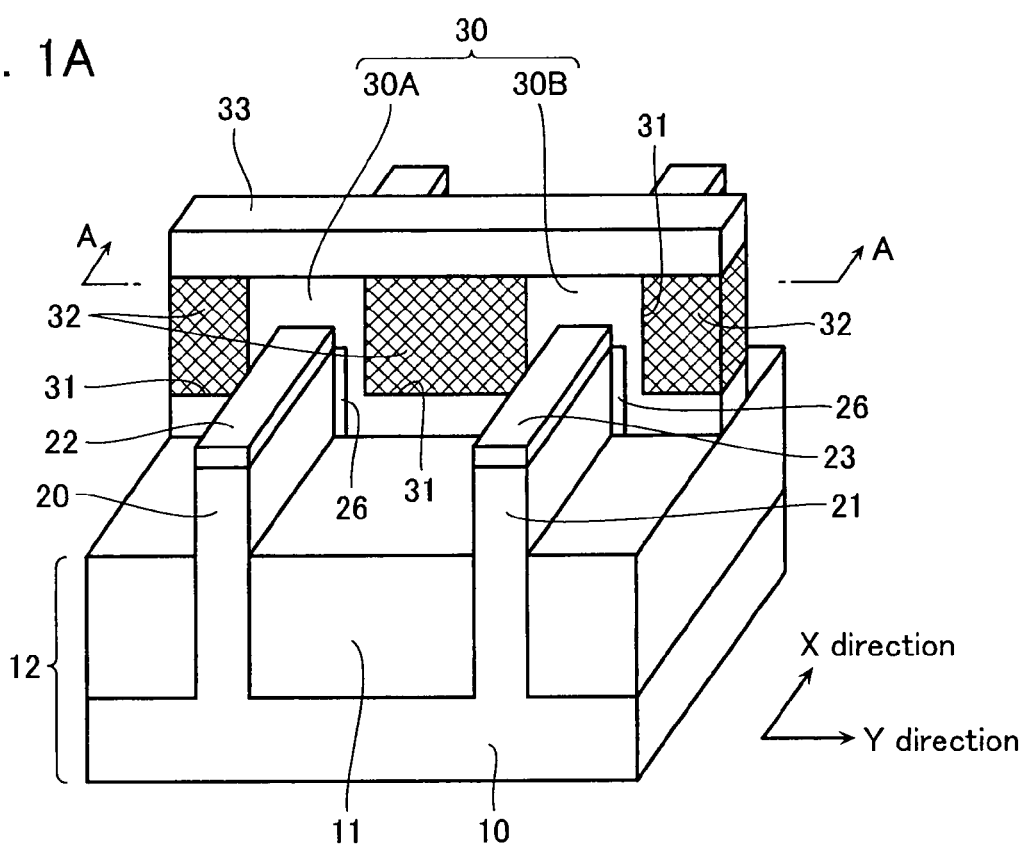
FIGS. 1A and 1B are diagrams showing the configuration of a Fin FET according to a first embodiment.

FIG. 1A is a diagram showing the configuration of a Fin FET according to a first embodiment.

An insulating layer 11 as a silicon oxide ($SiO_2$) film is formed on a silicon wafer 10, and two fins 20 and 21 are formed on a top face of the insulating layer 11 so that their longitudinal direction is set in an X direction. The fins 20 and 21 are made of, for example, a semiconductor material such as silicon. The Fin FET according to the first embodiment is constructed by a bulk substrate 12 in which the silicon wafer 10 and the fins 20 and 21 divide the insulating layer 11 and are coupled.

Insulating layers 22 and 23 are formed on the top face of the fins 20 and 21, respectively. The insulating layers 22 and 23 are formed by, for example, a silicon nitride (SiN) film. A gate electrode 30 is formed in such a manner that a first gate electrode 30A formed so as to cover the top face and both side faces of the fin 20 and a second gate electrode 30B formed so as to cover the top face and both side faces of the fin 21 extend continuously in the Y direction. The gate electrode 30 is made of, for example, polysilicon (hereinbelow, poly Si). Although two fins are used as an example in the first embodiment, any plural number of fins may be provided. In a Fin FET, at least side faces of a fin and, sometimes, even the top face of the fin are used as a channel region. Since the insulating layers 22 and 23 are formed on the top face of the fins in the first embodiment, both side faces are used as the channel regions. In the following, a mode using both side faces of a fin as the channel region will be called a double-gate type, and a mode using both side faces and the top face as the channel region will be called a tri-gate type. Like a common Fin FET, a gate oxide film 26 is formed on faces which are in contact with the gate electrode 30 and the fins 20 and 21.

Figure 1B:
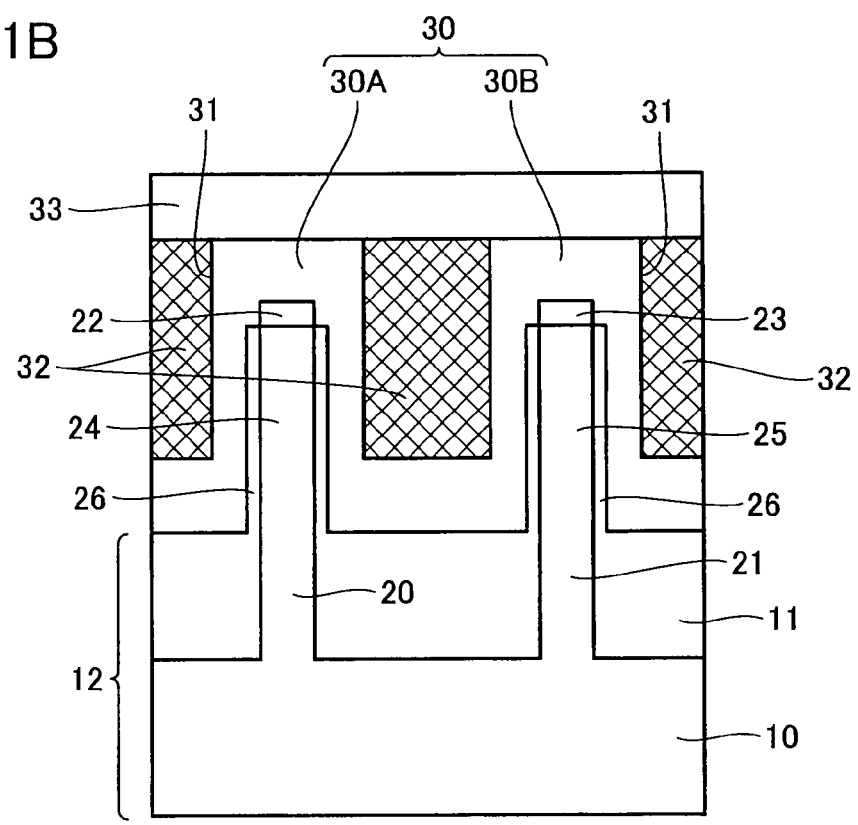

A sectional structure of the Fin FET according to the first embodiment will now be described with reference to FIGS. 1B to 2B. The gate electrode 30 is formed so as to cover the fins 20 and 21. In the gate electrode 30, regions 31 on the side faces of the fins 20 and 21 are removed (hereinbelow, the regions 31 will be called "removed regions 31"). In the removed region 31, a member 32 is buried (buried member 32). Therefore, the buried member 32 is formed at the lateral portion of the side faces of the fins 20 and 21 except the top faces of the fins 20 and 21. In FIG. 1B, the bottoms of the removed regions 31 exist between the top face of the gate electrode 30 and the top face of the insulating layer 11. Specifically, the bottom face does not reach the top face of the insulating layer 11, and poly Si as the material of the gate electrode 30 exists between the bottom face of the buried member 32 and the surface of the insulating layer 11. In addition, an upper portion of the buried member 32 is formed higher than the top faces of the fins 20 and 21. The buried member 32 is made of a material having lattice constant different from that of poly Si as the material of the gate electrode 30, such as silicon germanium (hereinbelow, SiGe). The buried member 32 can be formed by, for example, CVD. The buried member 32 is formed so that its conduction type is the same as that of the gate electrode 30. With this configuration, the resistance value of the fins 20 and 21 decreases and a voltage is applied more easily to the bottom of the fins 20 and 21 as compared with the case where the conduction type of the buried member 32 is different from that of the gate electrode 30. For example, when the gate electrode 30 is of the "n" type, the buried member 32 is also formed of the "n" type. The buried member 32 having the same conduction type as that of the gate electrode 30 can be formed by doping an impurity during execution of CVD or the like. Alternatively, after formation of the buried member 32, the buried member 32 may be doped with an impurity by ion implantation or the like.

In the first embodiment as described above, by burying SiGe having lattice constant larger than that of poly Si as the material of the gate electrode 30 in the removed region 31 to form the buried member 32, compression stress is generated in the gate electrode 30. As a result, the compression stress is applied to channel regions 24 and 25 in the fins 20 and 21, thereby increasing carrier mobility in a MOSFET. Since the gate electrode 30 is continuously formed between the fins 20 and 21, the stress in the buried member 32 buried in the removed region 31 between the fins 20 and 21 is laconically applied to the channel regions 24 and 25 in the fins 20 and 21 disposed on both sides.

The material of the buried member 32 is not limited to SiGe but any material may be used as long as compression stress can be applied to the channel regions 24 and 25. By using a material having density higher than that of the material of the gate electrode 30 in place of the material having lattice constant different from that of the material of the gate electrode 30, the compression stress can be applied to the channel regions 24 and 25. For example, by burying amorphous silicon (hereinbelow, amorphous Si) having density higher than that of poly Si as the buried member 32 in the removed region 31 and performing heat treatment to increase the volume of amorphous Si, the compression stress can be applied to the channel regions 24 and 25.

The stress applied to the channel regions 24 and 25 is not limited to compression stress but may be tensile stress. For example, a material having density lower than that of poly Si, such as silicon carbide obtained by doping silicon with carbon (hereinbelow, SiC) can be employed as the material of the buried member 32. By forming the buried member 32 in the removed region 31, tensile stress can be applied to the channel regions 24 and 25. A similar effect can be obtained by burying amorphous Si having density lower than that of poly Si in place of SiC in the removed region 31 as the material of the buried member 32 and performing heat treatment to form polycrystal.

Figure 2A:
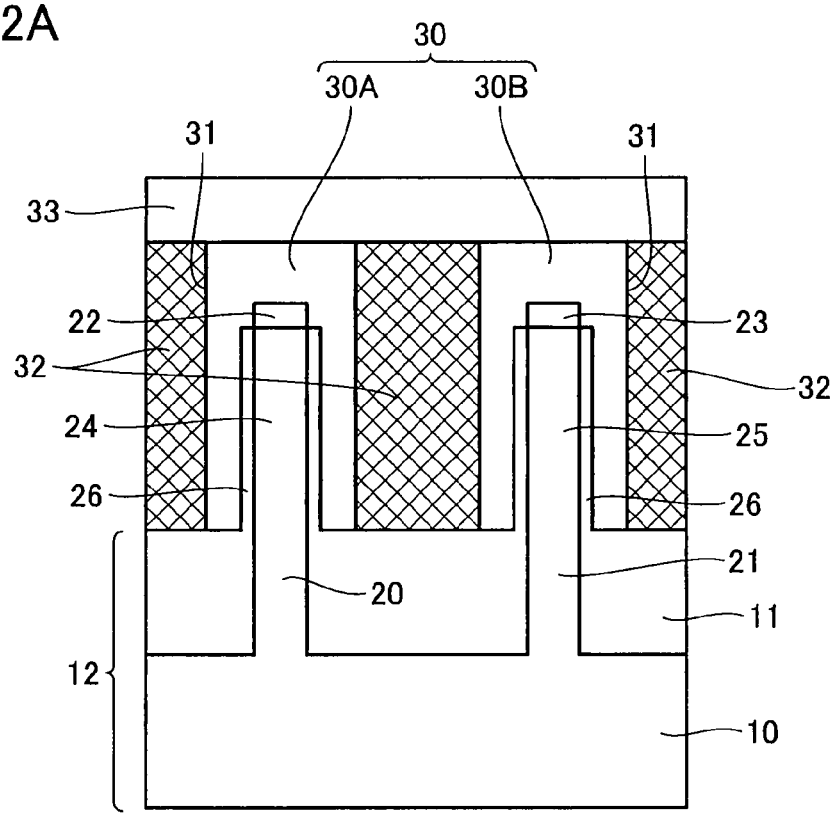
FIGS. 2A and 2B are diagrams showing a mode in which a member is buried to the surface of an insulating layer and a mode in which the member is buried to the inside of the insulating layer.
Figure 2B:
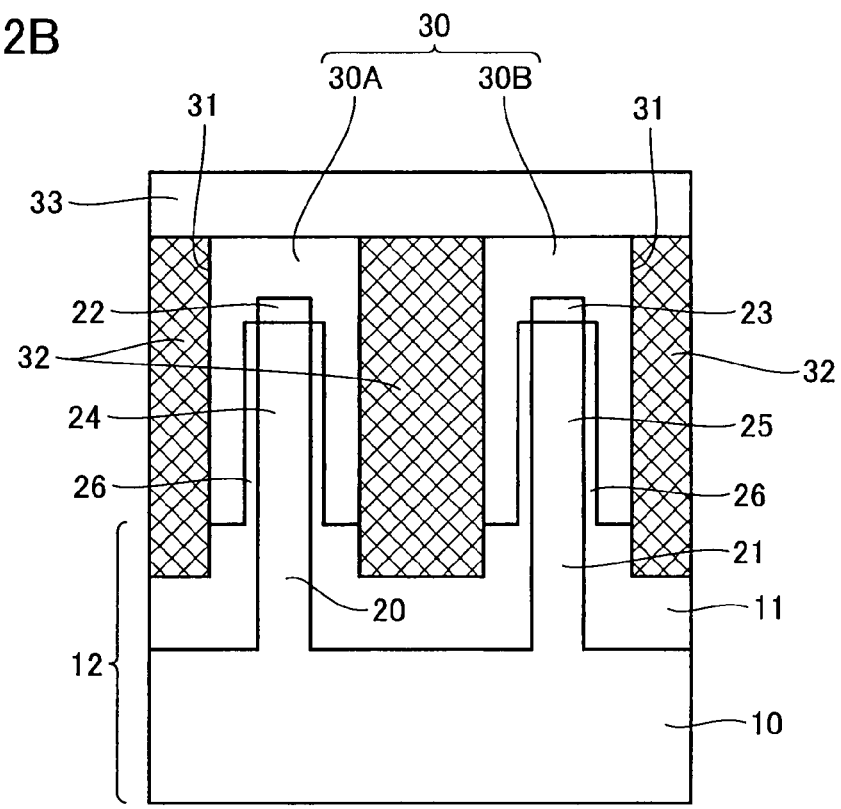

The bottom of the buried member 32 may be positioned between the top face of the gate electrode 30 and the surface of the insulating layer 11 as shown in FIG. 1B. It may reach the surface of the insulating layer 11 as shown in FIG. 2A or reach a point below the surface of the insulating layer 11 as shown in FIG. 2B. Therefore, the buried member 32 is formed at the portion lower than that of the bottom end of the gate oxide film 26. It is preferable, however, that it does not penetrate the insulating layer 11 to reach the silicon wafer 10. In any case, the stress (compression stress or tensile stress) can be applied to the channel regions 24 and 25.

The case of using poly Si as the material of the gate electrode 30 has been described in the first embodiment. A similar effect can be also obtained by a method of using a metal or a conductive compound for the gate electrode 30, and burying a material having a linear expansion coefficient different from that of the material of the gate electrode 30 to generate a stress in the gate electrode 30 and apply the stress to the channel regions.

Second Embodiment

Figure 3:
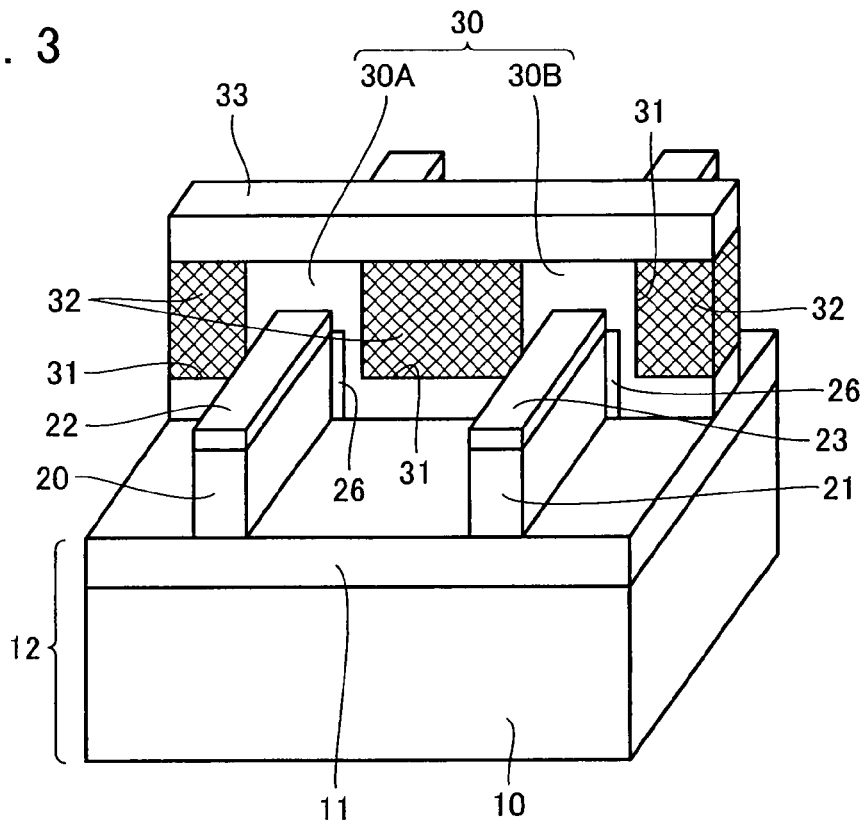
FIG. 3 is a diagram showing the configuration of a Fin FET according to a second embodiment.

FIG. 3 is a configuration diagram of a Fin FET according to a second embodiment. The same reference numerals are designated to the same parts as those of the first embodiment. The second embodiment relates to a Fin FET having an SOI (Silicon On Insulator) substrate structure, and the structure of the substrate is different from that of the first embodiment.

In the Fin FET according to the second embodiment, an insulating layer 11 as an oxide film ($SiO_2$) is formed on a silicon wafer 10, and two fins 20 and 21 made of single-crystal silicon are formed on a top face of the insulating layer 11 as an SOI form in which their longitudinal direction is set in an X direction. In an SOI substrate 13, by forming the fins 20 and 21 made of silicon on the insulating layer 11 as an oxide film, parasitic capacitance of a transistor part can be reduced more than that in a Fin FET using a bulk substrate. Therefore, operation speed can be improved and power consumption can be reduced.

The parts such as a gate electrode 30 and a buried member 32 are similar to those of the first embodiment. That is, the buried member 32 may be made of a material having lattice constant different from that of poly Si as the material of the gate electrode 30. The buried member 32 may be formed so that its conduction type is the same as that of the gate electrode 30. For the buried member 32, a material having density higher than that of poly Si or a material having density lower than that of poly Si may be used. Consequently, a stress can be applied to the channel regions 24 and 25 in the fins 20 and 21. An effect similar to that of the first embodiment can be obtained. The bottom of the buried member 32 may not reach the surface of the insulating layer 11 as shown in FIG. 3 or may reach the surface of the insulating layer 11 as shown in FIG. 2A. The bottom of the buried member 32 may penetrate the surface of the insulating layer 11 and reach the inside of the insulating layer 11 as shown in FIG. 2B. It is preferable, however, that it does not penetrate the insulating layer 11 to reach the silicon wafer 10.

Third Embodiment

Figure 4:
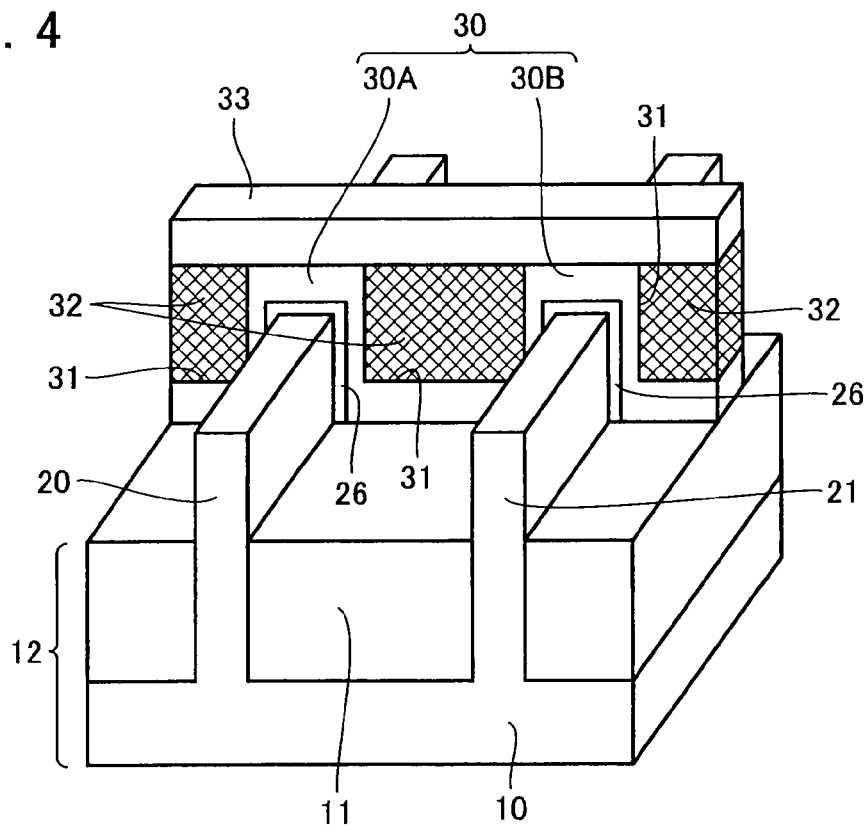
FIG. 4 is a diagram showing the configuration of a Fin FET according to a third embodiment.

FIG. 4 is a configuration diagram of a Fin FET according to a third embodiment. The same reference numerals are designated to the same parts as those of the first embodiment. The third embodiment relates to a tri-gate Fin FET in which the insulating layers 22 and 23 are not formed on the top faces of the fins 20 and 21, and the top faces of the fins 20 and 21 are also used as the channel regions 24 and 25. The third embodiment is different from the first embodiment only in this part.

In the tri-gate Fin FET, the opening/closing of a channel is controlled in three directions. Consequently, the leak current when the FET is off can be reduced more than the double-gate type in which the opening/closing of a channel is controlled in two directions.

The parts such as a gate electrode 30 and a buried member 32 are similar to those of the first embodiment. That is, the buried member 32 may be made of a material having a lattice constant different from that of poly Si as the material of the gate electrode 30. The buried member 32 may be formed so that its conduction type becomes the same as that of the gate electrode 30. For the buried member 32, a material having density higher than that of poly Si or a material having a density lower than that of poly Si may be used. Consequently, a stress can be applied to the channel regions 24 and 25 in the fins 20 and 21. An effect similar to that of the first embodiment can be obtained.

The bottom of the buried member 32 may not reach the surface of the insulating layer 11 as shown in FIG. 4 or may reach the surface of the insulating layer 11 as shown in FIG. 2A. The bottom of the buried member 32 may penetrate the surface of the insulating layer 11 and reach the inside of the insulating layer 11 as shown in FIG. 2B. It is preferable, however, that it does not penetrate the insulating layer 11 to reach the silicon wafer 10.

Fourth Embodiment

Figure 5:
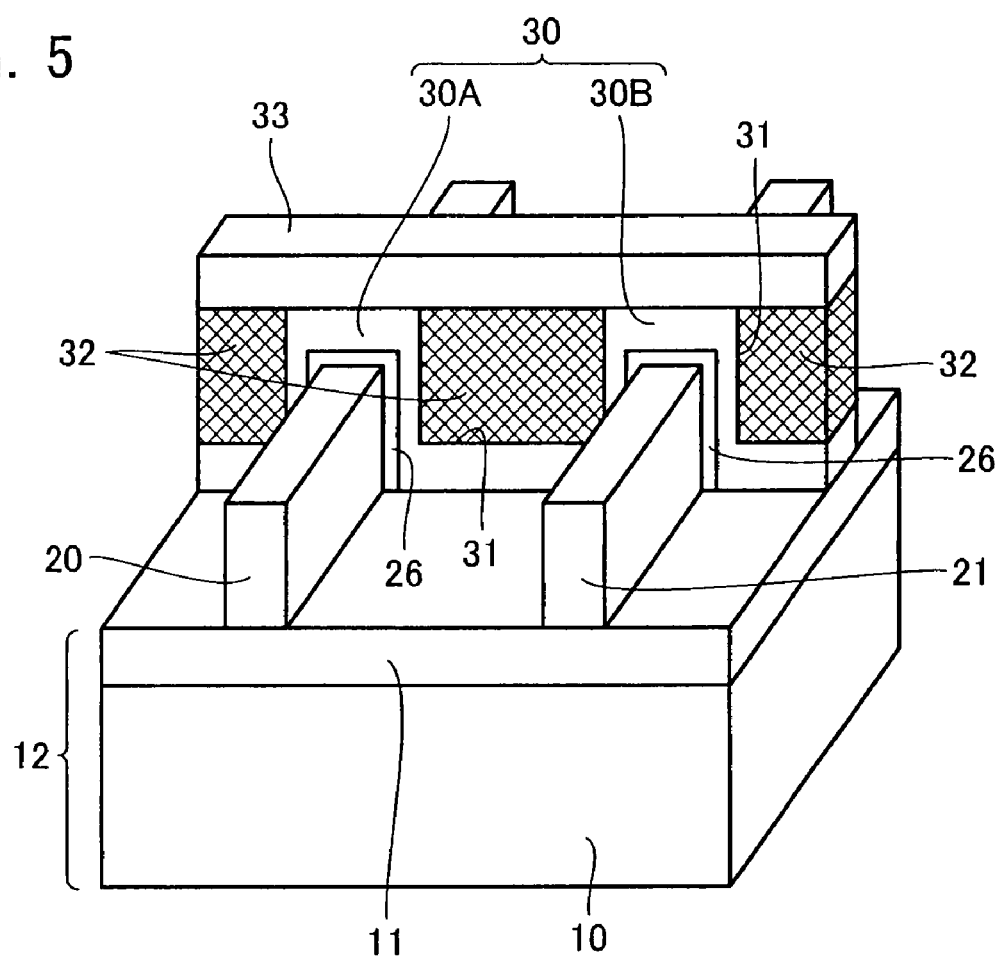
FIG. 5 is a diagram showing the configuration of a Fin FET according to a fourth embodiment.

FIG. 5 is a configuration diagram of a Fin FET according to a fourth embodiment. The same reference numerals are designated to the same parts as those of the first embodiment. The fourth embodiment is similar to the first embodiment except that the substrate is of the SOI type, and the gate is of the tri-gate type. Therefore, in the fourth embodiment, the operation speed can be improved, power consumption can be reduced, and the leak current when the FET is off can be reduced more than the first embodiment. Since the parts such as a gate electrode 30 and a buried member 32 are similar to those of the first embodiment, a stress can be applied to the channel regions 24 and 25 in the fins 20 and 21. An effect similar to that of the first embodiment can be obtained.

The bottom of the buried member 32 may not reach the surface of the insulating layer 11 as shown in FIG. 5 or may reach the surface of the insulating layer 11 as shown in FIG. 2A. The bottom of the buried member 32 may penetrate the surface of the insulating layer 11 and reach the inside of the insulating layer 11 as shown in FIG. 2B. It is preferable that it does not penetrate the insulating layer 11 to reach the silicon wafer 10.

Fifth Embodiment

Figure 8A:
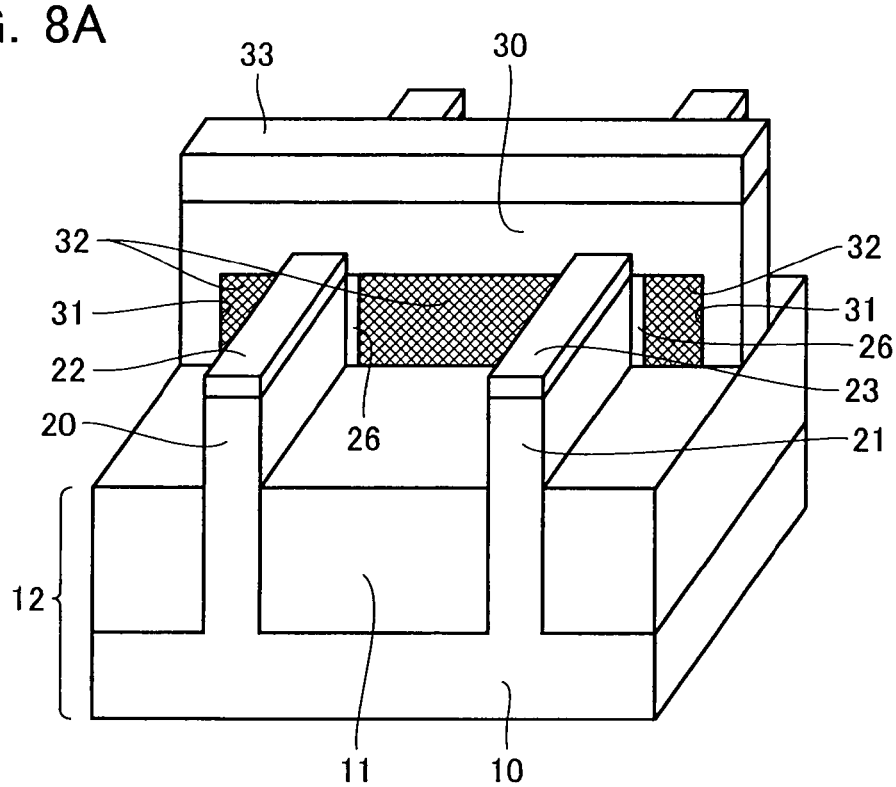
FIGS. 8A and 8B are diagrams showing the configuration of a Fin FET according to a fifth embodiment.

FIG. 8A is a configuration diagram of a Fin FET according to a fifth embodiment. The same reference numerals are designated to the same parts as those of the first embodiment. The fifth embodiment is similar to the first embodiment except that the buried member 32 is made of a metal and, further, the buried member 32 is formed even to the surface of a gate oxide film 26 formed on side faces of fins 20 and 21 as shown in FIG. 8A. In this embodiment, an upper end of the buried member 32 is formed on the approximately same level of the top faces of the fins 20 and 21.

Also by a method of using metal for the buried member 32 and burying a material having a linear expansion coefficient different from that of the gate electrode 30 to generate a stress in the gate electrode 30 and apply the stress to a channel region, an effect similar to that of the first embodiment can be obtained.

The bottom of the buried member 32 may reach the surface of the insulating layer 11 as shown in FIG. 8A or may penetrate the surface of the insulating layer 11 and reach the inside of the insulating layer 11 as shown in FIG. 2B. Preferably, it may not penetrate the insulating layer 11 and reach the silicon wafer 10.

Figure 8B:
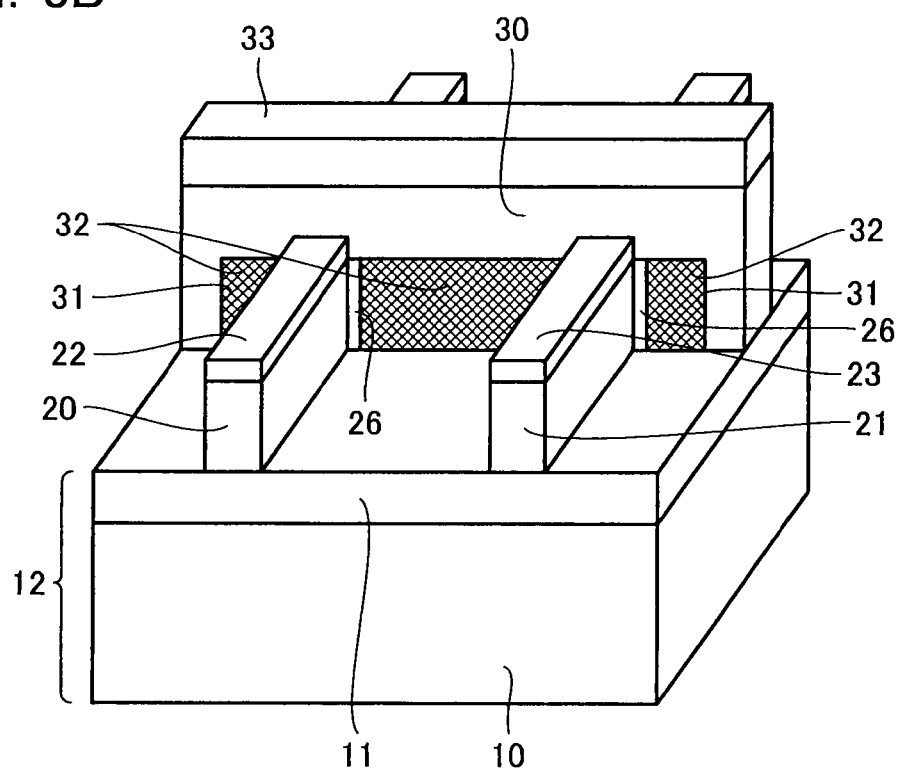

As shown in FIG. 8B, an SOI substrate may be used. A Fin FET shown in FIG. 8B can realize improved operation speed and reduced power consumption more than the Fin FET shown in FIG. 8A.

Also by a method of using a metal for the buried member 32 and burying a material having a linear expansion coefficient different from that of the gate electrode 30 to generate a stress in the gate electrode 30 and apply the stress to a channel region, an effect similar to that of the first embodiment can be obtained.

The bottom of the buried member 32 may reach the surface of the insulating layer 11 as shown in FIG. 8B or may penetrate the surface of the insulating layer 11 and reach the inside of the insulating layer 11 as shown in FIG. 2B. It is preferable, however, that it does not penetrate the insulating layer 11 to reach the silicon wafer 10.

Sixth Embodiment

Figure 9A:
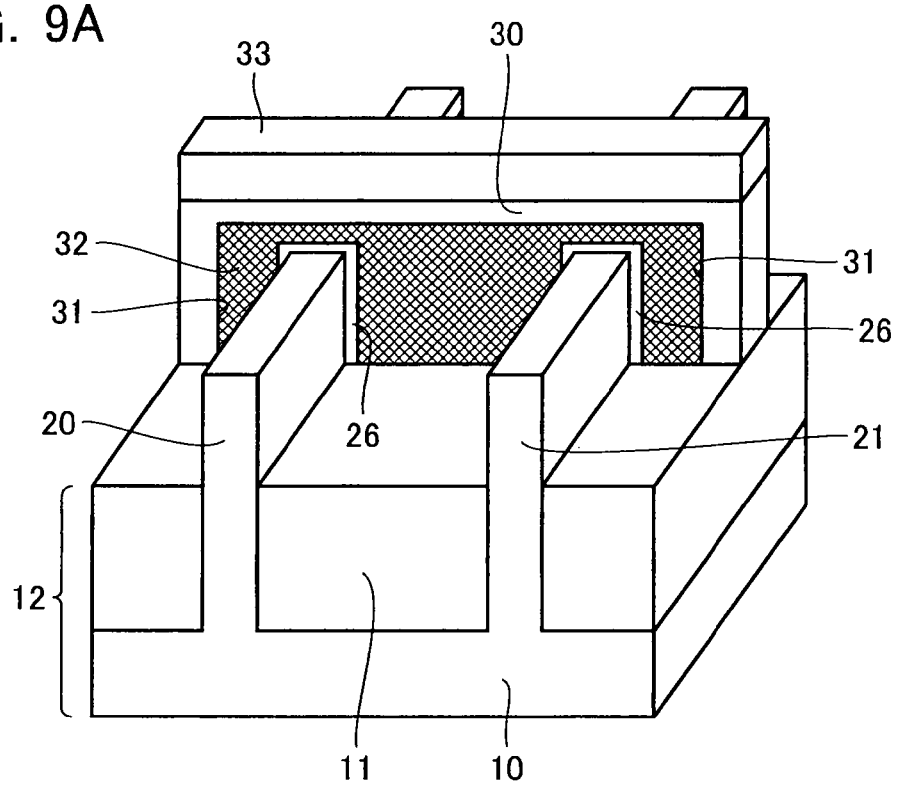
FIGS. 9A and 9B are diagrams showing the configuration of a Fin FET according to a sixth embodiment.

FIG. 9A is a configuration diagram of a Fin FET according to a sixth embodiment. The same reference numerals are designated to the same parts as those of the first embodiment. The sixth embodiment is similar to the fifth embodiment except that the gate is of a tri-gate type.

In the sixth embodiment, leak current when the FET is off can be reduced more than that in the fifth embodiment. Further, since a buried member 32 is formed also on the top faces of fins 20 and 21, a more stress can be applied to channel regions 24 and 25 in the fins 20 and 21 than in the fifth embodiment.

The bottom of the buried member 32 may reach the surface of the insulating layer 11 as shown in FIG. 9A or may penetrate the surface of the insulating layer 11 and reach the inside of the insulating layer 11 as shown in FIG. 2B. Preferably, it may not penetrate the insulating layer 11 and reach the silicon wafer 10.

Figure 9B:
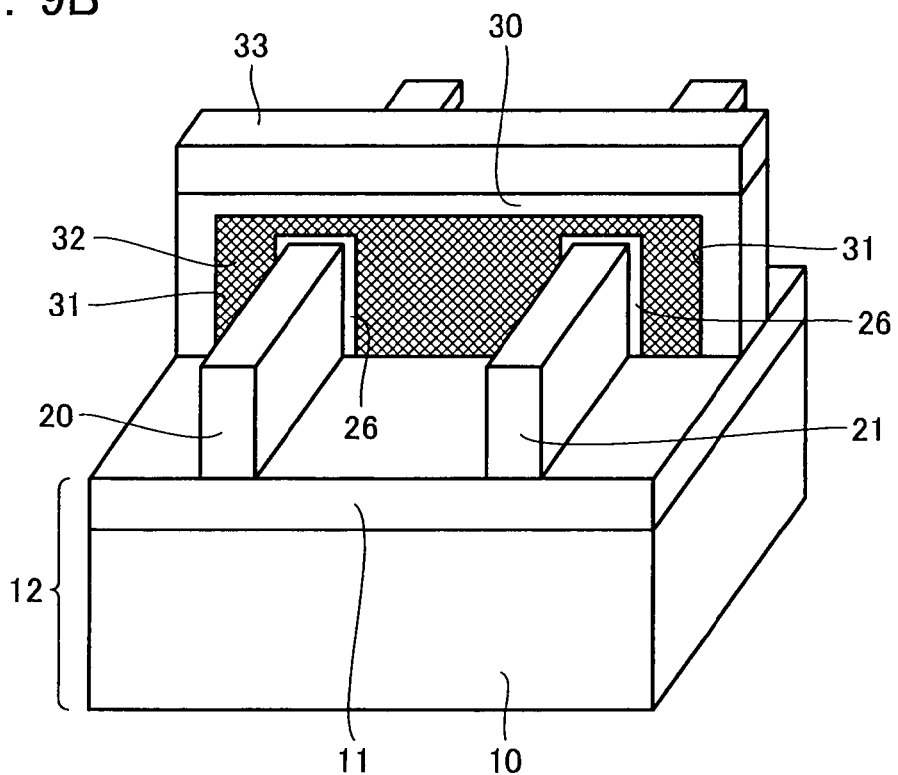

As shown in FIG. 9B, an SOI substrate may be used. A Fin FET shown in FIG. 9B can realize improved operation speed and reduced power consumption more than the Fin FET shown in FIG. 9A.

The bottom of the buried member 32 may reach the surface of the insulating layer 11 as shown in FIG. 9B or may penetrate the surface of the insulating layer 11 and reach the inside of the insulating layer 11 as shown in FIG. 2B. Preferably, it may not penetrate the insulating layer 11 and reach the silicon wafer 10.

A method of burying the buried member 32 in the embodiments of the present invention will now be described with reference to the drawings. The first embodiment will be taken as an example.

Figure 6A:
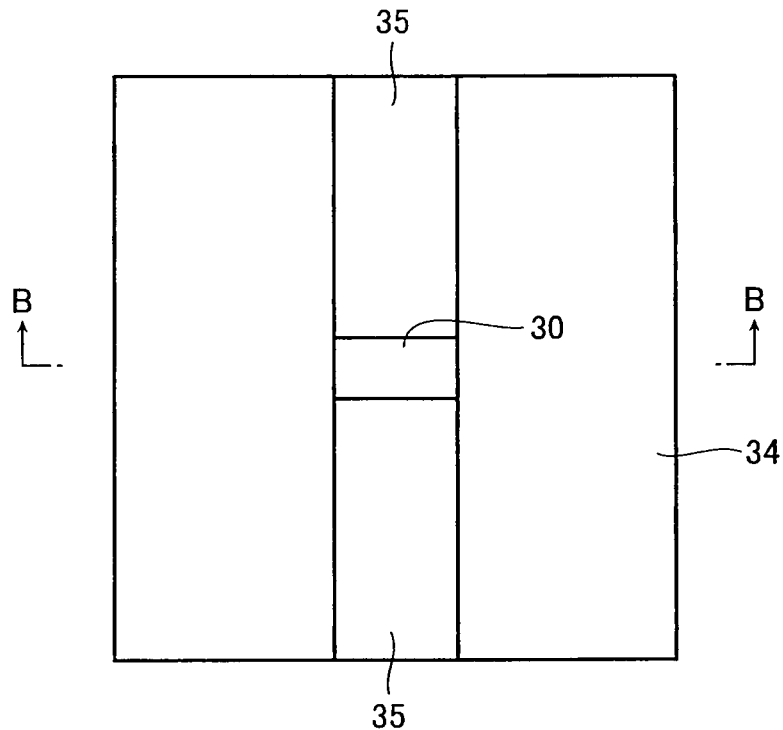
FIGS. 6A and 6B are diagrams for explaining a method of burying a member in a part of a gate electrode in a Fin FET according to an embodiment of the present invention.
Figure 6B:
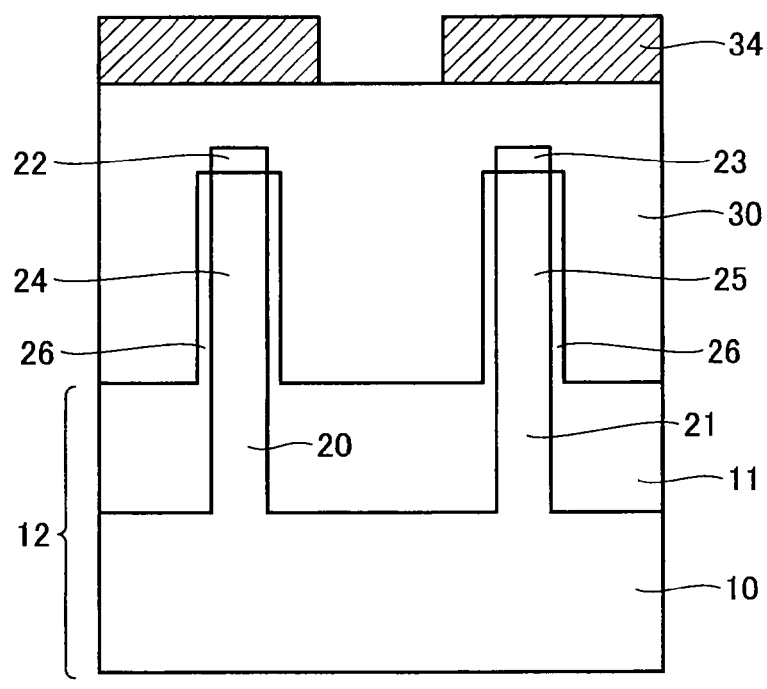

In order to pattern the removed region 31 formed in the gate electrode 30, a Fin FET is masked. FIG. 6A is a top view of the Fin FET in that state. FIG. 6B is a cross-sectional view taken along the line B-B of FIG. 6A. An interlayer insulating layer 35 is formed around the gate electrode 30.

Figure 7A:
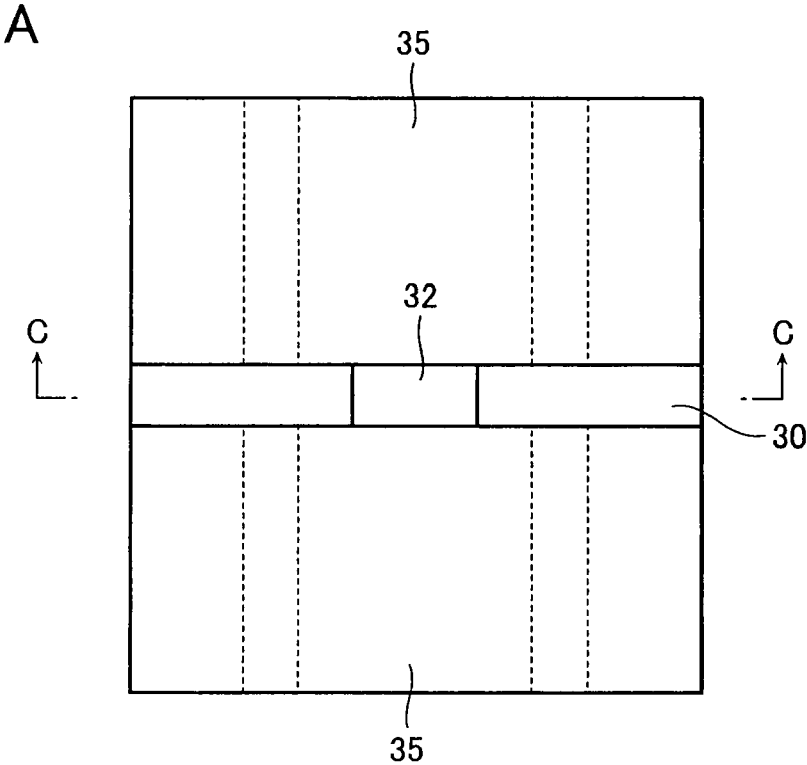
FIGS. 7A and 7B are diagrams for explaining a method of burying a member in a part of a gate electrode in a Fin FET according to an embodiment of the present invention.
Figure 7B:
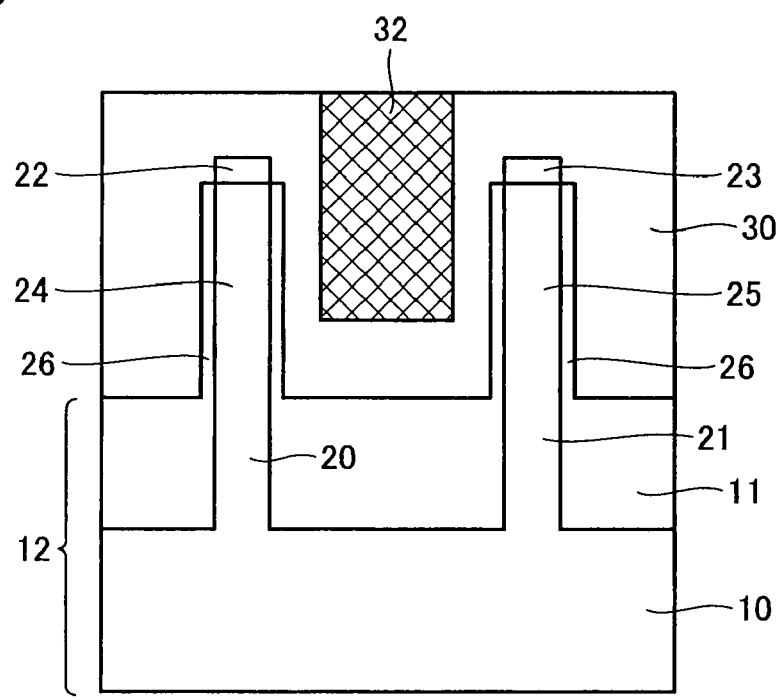

By etching patterned portions in poly Si of the gate electrode 30, the removed regions 31 are formed. The etching is, for example, reactive ion etching (RIE). The etching is not limited to RIE but may be dry etching or wet etching. The buried member 32 is buried in the removed regions 31 by CVD, after which the top face of the gate electrode 30 is planarized. The buried member 32 can be formed by, for example, doping an impurity during execution of CVD. The impurity doping may be performed by ion implantation or the like after formation of the buried member 32. FIG. 7A is a top view of a Fin FET after the planarization, and FIG. 7B is a cross-sectional view taken along the line C-C.

After that, by siliciding the top face of the gate electrode 30, a Fin FET capable of applying a normal stress to the channel parts in the fins can be manufactured.

What is claimed is:

1. A fin transistor comprising:
   a substrate;
   a plurality of semiconductor fins formed on the substrate;
   a gate electrode covering a channel region of the semiconductor fins; and
   a member as a stress source for the semiconductor fins buried in a region of the gate electrode and the region provided between the semiconductor fins, and
   the member being made of a different material from the gate electrode, wherein the member is made of a metal or a conductive compound, and is formed so as to cover a channel region in the semiconductor fin with a gate insulating film interposed therebetween.

2. The fin transistor according to claim 1, wherein the gate electrode is made of a metal or a conductive compound, and
the member is made of a material having linear expansion coefficient different from that of the material of the gate electrode.

3. The fin transistor according to claim 1, wherein the gate electrode is made of polysilicon, and
the member is made of a material having lattice constant different from that of polysilicon.

4. The fin transistor according to claim 1, wherein the gate electrode is made of polysilicon, and
the member is made of amorphous silicon having density different from that of polysilicon.

5. The fin transistor according to claim 1, wherein the gate electrode and the member are made of materials of the same conduction type.

6. The fin transistor according to claim 1, further comprising a gate insulating film formed between a channel region in the semiconductor fins and the gate electrode, wherein
the member is formed at a portion lower than that of a bottom end of the gate insulating film on a side face of the semiconductor fins.

7. The fin transistor according to claim 1, wherein an upper portion of the member is formed higher than a top faces of the semiconductor fins.

8. The fin transistor according to claim 1, wherein an upper end of the member is formed on the approximately same level of top faces of the semiconductor fins.

9. A fin transistor comprising:
a substrate;
a plurality of semiconductor fins formed on the substrate;
a gate electrode covering a channel region of the semiconductor fins; and
a member as a stress source for the semiconductor fins buried in a region of the gate electrode and the region provided between the semiconductor fins, and
the member being made of a different material from the gate electrode, wherein
the member is formed at side faces of the semiconductor fins except top faces of the semiconductor fins, and the member is in contact with a gate insulating layer on the side faces of the semiconductor fins.

10. A fin transistor comprising:
a semiconductor substrate;
a plurality of semiconductor fins formed over the substrate so as to be isolated from the semiconductor substrate by an insulating layer;
a gate electrode covering a channel region of the semiconductor fins; and
a member as a stress source for the semiconductor fins buried in a region of the gate electrode and the region provided between the semiconductor fins, and
the member being made of a different material from the gate electrode, wherein
the member is made of a metal or a conductive compound, and is formed so as to cover a channel region in the semiconductor fin with a gate insulating film interposed therebetween.

11. The fin transistor according to claim 10, wherein the gate electrode is made of a metal or a conductive compound, and
the member is made of a material having linear expansion coefficient different from that of the material of the gate electrode.

12. The fin transistor according to claim 10, wherein the gate electrode is made of polysilicon, and
the member is made of a material having lattice constant different from that of polysilicon.

13. The fin transistor according to claim 10, wherein the gate electrode is made of polysilicon, and
the member is made of amorphous silicon having density different from that of polysilicon.

14. The fin transistor according to claim 10, wherein the gate electrode and the member are made of materials of the same conduction type.

15. The fin transistor according to claim 10, further comprising a gate insulating film formed between a channel region in the semiconductor fins and the gate electrode, wherein
the member is formed at a portion lower than that of a bottom end of the gate insulating film on a side face of the semiconductor fins.

16. The fin transistor according to claim 10, wherein an upper portion of the member is formed higher than top faces of the semiconductor fins.

17. The fin transistor according to claim 10, wherein an upper end of the member is formed on the approximately same level of top faces of the semiconductor fins.

18. A fin transistor comprising:
a semiconductor substrate;
a plurality of semiconductor fins formed over the substrate so as to be isolated from the semiconductor substrate by an insulating layer;
a gate electrode covering a channel region of the semiconductor fins; and
a member as a stress source for the semiconductor fins buried in a region of the gate electrode and the region provided between the semiconductor fins, and
the member being made of a different material from the gate electrode, wherein the member is formed at side faces of the semiconductor fins except top faces of the semiconductor fins, and the member is in contact with a gate insulating layer on the side faces of the semiconductor fins.

* * * * *